(12) United States Patent
Zhang et al.

(10) Patent No.: US 10,490,135 B2
(45) Date of Patent: Nov. 26, 2019

(54) ENABLE SIGNAL GENERATION CIRCUIT, POWER CONVERSION CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventors: Chenggeng Zhang, Beijing (CN); Boya Zhang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 16/023,677

(22) Filed: Jun. 29, 2018

(65) Prior Publication Data

US 2018/0308433 A1 Oct. 25, 2018

Related U.S. Application Data

(62) Division of application No. 15/520,681, filed as application No. PCT/CN2015/098366 on Dec. 23, 2015, now Pat. No. 10,037,733.

(30) Foreign Application Priority Data

Aug. 25, 2015 (CN) .......................... 2015 1 0527125

(51) Int. Cl.
*H03K 3/00* (2006.01)
*G09G 3/3283* (2016.01)
(Continued)

(52) U.S. Cl.
CPC ......... *G09G 3/3283* (2013.01); *G09G 3/3208* (2013.01); *H02M 1/32* (2013.01);
(Continued)

(58) Field of Classification Search
None
See application file for complete search history.

(56) References Cited

U.S. PATENT DOCUMENTS 9,461,633 B1 * 10/2016 Foroudi ............... H03K 3/0372
10,037,733 B2 * 7/2018 Zhang .................... H03K 3/012
(Continued)

FOREIGN PATENT DOCUMENTS

CN 101414748 A 4/2009
CN 101728823 A 6/2010
(Continued)

OTHER PUBLICATIONS

Written Opinion of the International Searching Authority from PCT Application No. PCT/CN2015/098366, dated May 20, 2016 (5 pages).

*Primary Examiner* — Long Nguyen
(74) *Attorney, Agent, or Firm* — Harness, Dickey & Pierce, P.L.C.

(57) ABSTRACT

The present disclosure discloses an enable signal generation circuit, comprising: an input module configured to input a direct current signal from the first input terminal to a first node; a transmission module configured to transmit the direct current signal at the first node to an output terminal; a first conducting module and a second conducting module configured to conduct signals in an alternating current signal from the second input terminal to the first node; a first filter module configured to filter the signal at the first node such that, at the first node, the alternating current signal from the second input terminal is conducted to a common terminal.

(Continued)

The second input terminal is connected to the output terminal. The present disclosure simplifies the circuit structure and solves the problem caused by the difference between timing sequences of inputted signals.

16 Claims, 5 Drawing Sheets

(51) Int. Cl.
*H02M 1/36* (2007.01)
*H03K 3/012* (2006.01)
*G09G 3/3208* (2016.01)
*H02M 1/32* (2007.01)
*H05B 33/08* (2006.01)

(52) U.S. Cl.
CPC .............. *H02M 1/36* (2013.01); *H03K 3/012* (2013.01); *H05B 33/0809* (2013.01); *G09G 2300/0426* (2013.01); *G09G 2310/08* (2013.01); *G09G 2330/028* (2013.01); *G09G 2330/04* (2013.01); *H05B 33/0896* (2013.01)

(56) References Cited

U.S. PATENT DOCUMENTS

2006/0279565 A1* 12/2006 Wei ............... H05B 33/0815
                                                          345/212
2017/0316743 A1 11/2017 Zhang et al.

FOREIGN PATENT DOCUMENTS

| CN | 102263494 A | 11/2011 |
| CN | 102931826 A | 2/2013 |
| CN | 202840935 U | 3/2013 |
| CN | 203799627 U | 8/2014 |
| CN | 203799628 U | 8/2014 |
| CN | 105048793 A | 11/2015 |

\* cited by examiner

ENABLE SIGNAL GENERATION CIRCUIT, POWER CONVERSION CIRCUIT AND DISPLAY DEVICE

CROSS-REFERENCE TO RELATED APPLICATIONS

This application is a divisional of U.S. patent application Ser. No. 15/520,681 filed Apr. 20, 2017, which is a national phase of International Application No. PCT/CN2015/098366 filed Dec. 23, 2015, which claims the benefit and priority of Chinese Patent Application No. 201510527125.4, filed Aug. 25, 2015. The entire disclosures of each of the above applications are incorporated herein by reference.

BACKGROUND

The present disclosure relates to the field of electronic technology, and particularly, to an enable signal generation circuit, a power conversion circuit, and a display device.

Conventionally, Enable Control pins and Single Wire Protocol pins are typically provided in a DC-DC power supply chip with adjustable output voltage. When a signal on the enable control pin is valid, an input voltage is input to the DC-DC power supply chip and an output voltage of the DC-DC power supply chip is controlled according to the number of pulses included in a signal on the single wire protocol pin.

In an Active-Matrix Organic Light-Emitting Diode (AMOLED) display device, the DC-DC power supply chip is used in cooperation with a source electrode drive chip. The output voltage of the DC-DC power supply chip is used to drive the light-emitting element. The source electrode drive chip is used to output a signal on the single wire protocol pin to the DC-DC power supply chip to control the output voltage value of the DC-DC power supply chip, so as to control the light-emitting intensity of the light-emitting element.

When the display device stars up, bias voltages are applied to the source electrode drive chip and the DC-DC power supply chip at the same time, and the signal on the single wire protocol pin is delayed in time by 10 to 30 milliseconds, compared to the input voltage of the DC-DC power supply chip. In addition, when the display device stars up, the expected starting up timing sequence is that: when opening the device, the output voltage of the DC-DC power supply chip at the output terminal has a default value, which is less than the operating voltage of the light-emitting element, and at the time the light-emitting element enters the critical point of being lightened; thereafter, the signal on the single wire protocol pin outputted from the source electrode drive chip is input to the DC-DC power supply chip to control the DC-DC power supply chip to generate the operating voltage required for the light-emitting element. Previously, there are cases where the signal on the single wire protocol pin is input to the DC-DC power supply chip prior to the input voltage, and the accomplishment of the above timing sequence cannot be ensured. In these cases, the inside of the DC-DC power supply chip may be impacted by a large current, which will make the current limiting circuit act and enter into a protection mode, causing the DC-DC power supply chip unable to start.

SUMMARY

Embodiments of the present disclosure provide an enable signal generation circuit, a power conversion circuit and a display device.

According to a first aspect, embodiments of the present disclosure provide an enable signal generation circuit comprising: an input module connected to a first input terminal, and configured to input a direct current signal from the first input terminal to a first node in response to an electric potential at the first input terminal higher than a preset voltage value; a transmission module, configured to transmit the direct current signal at the first node to an output terminal; a first conducting module, connected to a second input terminal, and configured to conduct a signal in an alternating current signal from the second input terminal, which is higher than the electric potential at the first node, to the first node; a first filter module, configured to filter a signal at the first node such that, at the first node, the alternating current signal from the second input terminal is conducted to a common terminal; and a second conducting module, configured to conduct a signal in an alternating current signal from the second input terminal, which is lower than the electric potential at the first node, to the common terminal. The second input terminal is connected to the output terminal.

In embodiments of the present disclosure, the input module comprises a first transistor. A control electrode of the first transistor is connected to the first input terminal, a first electrode of the first transistor is connected to the first input terminal, and a second electrode of the first transistor is connected to the first node.

In embodiments of the present disclosure, the input module further comprises a first resistor and a second resistor. A first terminal of the first resistor is connected to the first input terminal, and a second terminal of the first resistor is connected to a first terminal of the second resistor and the control electrode of the first transistor. A second terminal of the second resistor is connected to the common terminal. A resistance ratio between the first resistor and the second resistor is equal to a ratio, which is between the preset voltage value and the turn-on voltage of the first transistor, minus one.

In an embodiment of the disclosure, the transmission module comprises a third resistor, a first terminal of the third resistor is connected to the first node, and the second terminal of the third resistor is connected to the output terminal.

In embodiments of the present disclosure, the first conducting module comprises a first diode, an anode of the first diode is connected to the output terminal, and a cathode of the first diode is connected to the first node.

In embodiments of the present disclosure, the first filter module comprises a first capacitor, a first terminal of the first capacitor is connected to the first node and a second terminal of the first capacitor is connected to the common terminal.

In embodiments of the present disclosure, the second conducting module comprises a second diode, an anode of the second diode is connected to the common terminal, and a cathode of the second diode is connected to the output terminal.

In embodiments of the present disclosure, the circuit further comprises an isolation module, provided between the second input terminal and the output terminal, and configured to transmit an alternating current signal and isolating a direct current signal.

In embodiments of the present disclosure, the isolation module comprises a second capacitor, a first terminal of the second capacitor is connected to the second input terminal, and the second terminal of the second capacitor is connected to the output terminal.

In embodiments of the present disclosure, the circuit further comprises a second filter module, provided between the first input terminal and the common terminal, and configured to filter a signal from the first input terminal such that an alternating current signal at the first input terminal is conducted to the common terminal.

In an embodiment of the disclosure, the second filter module comprises a third capacitor, a first terminal of the third capacitor is connected to the first input terminal and a second terminal of the third capacitor is connected to the common terminal.

According to a second aspect, embodiments of the present disclosure provide an enable signal generation circuit comprising: an input module, connected to a first input terminal, and configured to input a direct current signal from the first input terminal to a first node in response to an electric potential at the first input terminal higher than a preset voltage value; a first filter module, configured to filter a signal at the first input terminal such that an alternating current signal at the first input terminal is conducted to a common terminal; a transmission module, connected to a second input terminal, and configured to transmit the direct current signal from the first input terminal to an output terminal in response that the direct current signal is received at the first node; a first conducting module, connected to the second input terminal, and configured to conduct a signal in an alternating current signal from the second input terminal, which is higher than the electric potential at the first input terminal, to the first input terminal; a second conducting module, connected to the second input terminal, and configured to conduct a signal in an alternating current signal from the second input terminal, which is lower than the electric potential at the common terminal to the common terminal. The second input terminal is connected to the output terminal.

In embodiments of the present disclosure, the input module comprises a second transistor. A control electrode of the second transistor is connected to the first input terminal, a first electrode of the second transistor is connected to the first input terminal, and a second electrode of the second transistor is connected to the first node.

In embodiments of the present disclosure, the input module further comprises a fourth resistor and a fifth resistor. A first terminal of the fourth resistor is connected to the first input terminal, and a second terminal of the fourth resistor is connected to a first terminal of the fifth resistor and the control electrode of the second transistor. A second terminal of the fifth resistor is connected to the common terminal. A resistance ratio between the fourth resistor and the fifth resistor is equal to a ratio, which is between the preset voltage value and a turn-on voltage of the second transistor, minus one.

In embodiments of the present disclosure, the first filter module comprises a fourth capacitor, a first terminal of the fourth capacitor is connected to the first input terminal, and a second terminal of the fourth capacitor is connected to the common terminal.

In embodiments of the present disclosure, the transmission module comprises a sixth resistor and a third transistor. A first terminal of the sixth resistor is connected to the output terminal and a second terminal of the sixth resistor is connected to the common terminal. A control electrode of the third transistor is connected to the first node, a first electrode of the third transistor is connected to the first input terminal, and a second electrode of the third transistor is connected to the output terminal.

In embodiments of the present disclosure, the first conducting module comprises a third diode, an anode of the third diode is connected to the output terminal, and a cathode of the third diode is connected to the first input terminal.

In embodiments of the present disclosure, the second conducting module comprises a fourth diode, an anode of the fourth diode is connected to the common terminal, and a cathode of the fourth diode is connected to the output terminal.

In embodiments of the present disclosure, the circuit further comprises an isolation module, provided between the second input terminal and the output terminal, and configured to transmit an alternating current signal and isolating an direct current signal.

In embodiments of the present disclosure, the isolation module comprises a fifth capacitor, a first terminal of the fifth capacitor is connected to the second input terminal, and a second terminal of the fifth capacitor is connected to the output terminal.

In embodiments of the present disclosure, the circuit further comprises a delay module, provided between the first node and the common terminal, and configured to extend the elapsed time during which the direct current signal from the first input terminal is input to the first node.

In embodiments of the present disclosure, the delay module comprises a sixth capacitor, a first terminal of the sixth capacitor is connected to the first node and a second terminal of the sixth capacitor is connected to the common terminal.

In embodiments of the present disclosure, the circuit further comprises a second filter module, provided between the output terminal and the common terminal, and configured to filter the signal at the output terminal such that, an alternating current signal other than the alternating current signal from the second input terminal is conducted to the common terminal.

In embodiments of the present disclosure, the second filter module comprises a seventh capacitor, a first terminal of the seventh capacitor is connected to the output terminal and a second terminal of the seventh capacitor is connected to the common terminal.

According to a third aspect, embodiments of the present disclosure provide a power conversion circuit comprising the enable signal generation circuit according to any one of the preceding.

According to a fourth aspect, embodiments of the present disclosure provide a data driving circuit comprising the power conversion circuit according to any one of the preceding.

According to a fifth aspect, embodiments of the present disclosure provide a display device comprising the data driving circuit according to any one of the preceding.

In the enable signal generation circuit provided by the embodiments of the present disclosure, in response that the electric potential at the first input terminal Vin is higher than the preset voltage value, the input module 101 may superimpose the direct current signal from the first input terminal Vin with the alternating current signal from the second input terminal Swire together through the transmission module 102 to the output terminal EN. In other cases, the electric potential at the first node PA corresponds to that of the common terminal GND, while the first conducting module 103 and the first filter module 104 may conduct the positive half of said alternating current signal to the common terminal GND, and the second conducting module 105 may conduct the negative half of said alternating current signal to the common terminal GND. Based on the above circuit structure, the present disclosure may automatically output the enable signal based on the input signal, thereby solving the problem that the DC-DC power supply chip does not work normally due to the difference between timing sequences of the inputted signals.

BRIEF DESCRIPTION OF THE DRAWINGS

In order to more clearly illustrate the technical solution in the embodiments of the present disclosure, the drawings to be used in the description for the embodiments will be briefly described below. Obviously, those skilled in the art may also obtain other drawings according to these drawings without creative work.

DETAILED DESCRIPTION

To make the technical solutions and advantages of the embodiments of the present disclosure clearer, the technical solutions in the embodiments of the present disclosure will be clearly and completely described below in conjunction with the accompanying drawings in the embodiments of the present disclosure. Obviously, the embodiments described are merely a part of, rather than all of, the embodiments of the present disclosure. All other embodiments obtained by those skilled in the art based on embodiments of the disclosure, without creative work, are within the scope of protection of the present disclosure.

Figure 1:
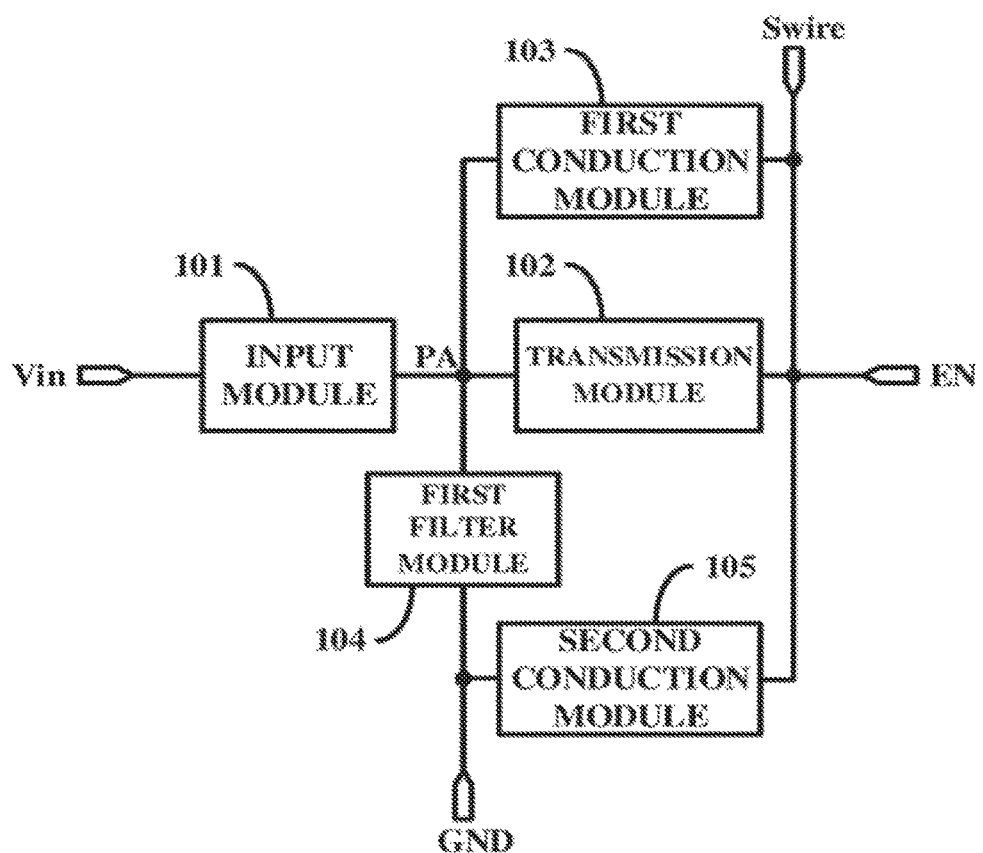
FIG. 1 is a block diagram of an enable signal generation circuit according to a first embodiment of the present disclosure.

FIG. 1 is a block diagram of an enable signal generation circuit according to a first embodiment of the present disclosure. Referring to FIG. 1, the enable signal generation circuit is connected to a common terminal GND, a first input terminal Vin, a second input terminal Swire, and an output terminal EN. The circuit comprises an input module 101, a transmission module 102, a first conducting module 103, a first filter module 104, and a second conducting module 105. The second input terminal Swire is connected to the output terminal EN. The input module 101 is connected to the first input terminal Vin, and inputs a direct current signal from the first input terminal Vin to a first node PA in response that the electric potential at the first input terminal Vin is higher than a preset voltage value. The transmission module 102 transmits the direct current signal at the first node PA to the output terminal EN. The first conducting module 103 is connected to the second input terminal Swire, and conducts the signal in the alternating current signal from the second input terminal Swire, which is higher than the electric potential at the first node PA, to the first node PA. The first filter module 104 filters the signal at the first node PA such that, at the first node PA, the alternating current signal from the second input terminal Swire is conducted to the common terminal GND. The second conducting module 105 is connected to the second input terminal Swire, and conducts the signal in the alternating current signal from the second input terminal Swire, which is lower than the electric potential at the first node PA to the common terminal GND.

In the embodiments of the present disclosure, in response that the electric potential at the first input terminal Vin is higher than the preset voltage value, the input module 101 may superimpose the direct current signal from the first input terminal Vin together with the alternating current signal from the second input terminal Swire through the transmission module 102 to the output terminal EN. In other cases, the electric potential at the first node PA corresponds to that of the common terminal GND, and the first conducting module 103 and the first filter module 104 may conduct the positive half of said alternating current signal to the common terminal GND, and the second conducting module 105 may conduct the negative half of said alternating current signal to the common terminal GND. According to the above circuit structure, the present disclosure can automatically output the enable signal based on the input signal, thereby solving the problem that the DC-DC power supply chip does not work normally due to the difference between the timing sequences of the inputted signals.

Figure 2:
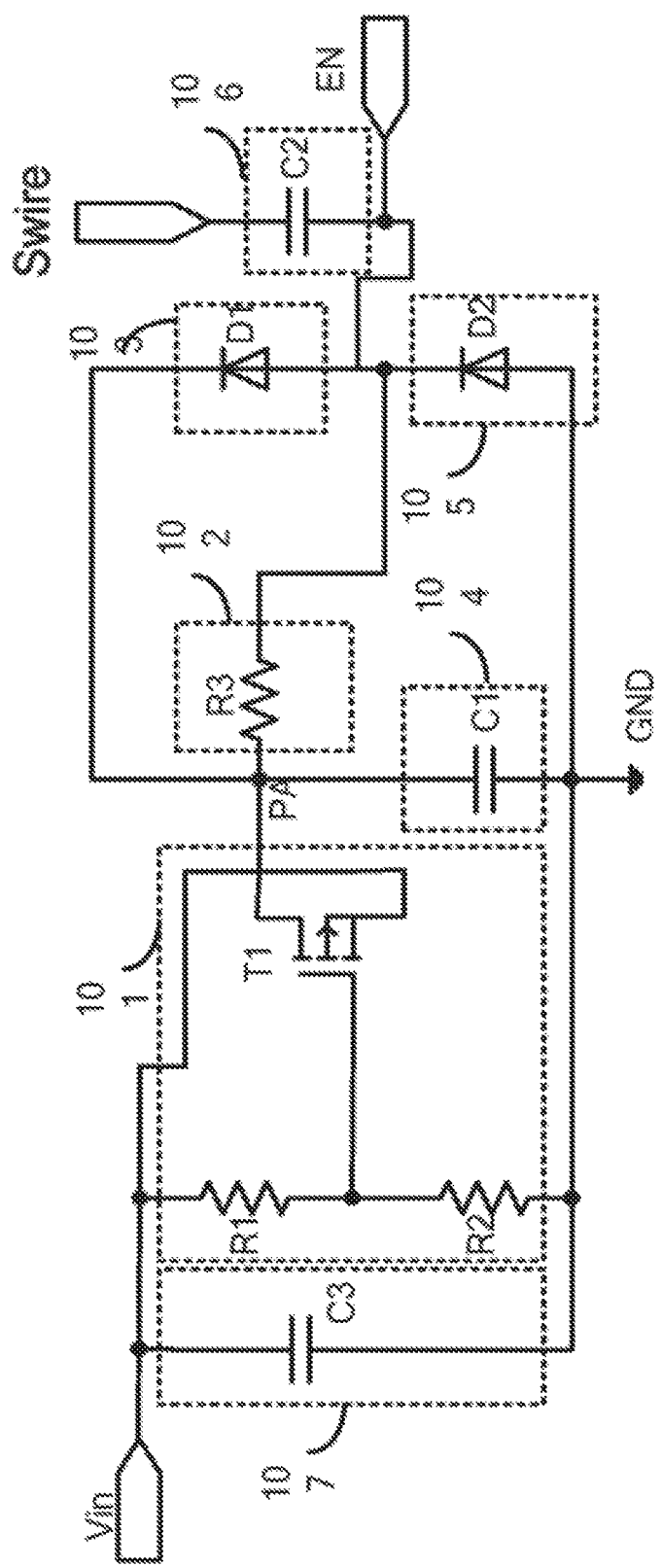
FIG. 2 is a schematic circuit diagram of the enable signal generation circuit of the embodiment shown in FIG. 1.

FIG. 2 is a schematic circuit diagram of the enable signal generation circuit of the embodiment shown in FIG. 1. Referring to FIG. 2, as a specific example of the input module 101, the input module 101 in the embodiment of the present disclosure comprises a first transistor T1. The control electrode of the first transistor T1 is connected to the first input terminal Vin, the first electrode of the first transistor T1 is connected to the first input terminal Vin, and the second electrode of the first transistor T1 is connected to the first node PA. For example, the first transistor T1 is a PMOS transistor, the control electrode of the first transistor T1 is the gate electrode, the first electrode of the first transistor T1 is the source electrode, and the second electrode of the first transistor T1 is the drain electrode. The gate electrode of the first transistor T1 is connected to the first input terminal Vin, the source electrode is connected to the first input terminal Vin, and the drain electrode is connected to the first node PA. In response that the electric potential difference between the gate electrode and the source electrode is sufficiently low, the first transistor T1 is turned on, such that the direct current signal from the first input terminal Vin is inputted to the first node PA. Of course, the resistance between the first input terminal Vin and the gate electrode of the first transistor T1 should be greater than the resistance between the first input terminal and the source electrode of the first transistor T1 such that in response that the electric potential at the first input terminal Vin is sufficiently high, the electric potential difference between the gate electrode and the source electrode of the first transistor T1 may be low enough to maintain the turning on of the first transistor T1.

The first transistor T1 may also be an NMOS transistor, the gate electrode of the first transistor T1 is connected to the first input terminal Vin, the drain electrode is connected to the first input terminal Vin, and the source electrode is connected to the first node PA. At this time, the resistance between the first input terminal Vin and the gate electrode of the first transistor T1 should be less than the resistance between the first input terminal and the source electrode of the first transistor T1 such that in response that the electric potential at the first input terminal Vin is sufficiently high, the electric potential difference between the gate electrode and the source electrode of the first transistor T1 may be high enough to maintain the turning on of the first transistor T1.

It should be noted that the transistor described in the present disclosure may be a Metal Oxide Semiconductor Field Effect Transistor (MOSFET) such as a Thin Film Transistor (TFT), and the material to form its active region may be determined according to the desired device performance under the applied scenario, and will not be described herein.

In order to provide the above preset voltage value, the input module 101 in the embodiment of the present disclosure further comprises a first resistor R1 and a second resistor R2. The first terminal of the first resistor R1 is connected to the first input terminal Vin, the second terminal is connected to the first terminal of the second resistor R2 and to the gate electrode of the first transistor T1 in the input module 101. The second terminal of the second resistor R2 is connected to the common terminal GND. Moreover, the resistance ratio between the first resistor and the second resistor is equal to the ratio, which is between the preset voltage value and the turn-on voltage of the first transistor T1, minus one. Thus, the resistance value of the first resistor R1 and the resistance value of the second resistor R2 can be set based on the turn-on voltage of the first transistor T1 to obtain a desired preset voltage value. For example, when the desired preset voltage value is 5V and the turn-on voltage of the first transistor T1 is 0.7 V, the resistance value of the first resistor R1 may be 43 kΩ and the resistance value of the second resistor R2 maybe 7 kΩ. Thus, when the voltage at the first input terminal Vin is higher than 5V, the first transistor T1 can be turned on.

As a specific example of the transmission module 102, the transmission module 102 in the embodiment of the present disclosure comprises a third resistor R3. The first terminal of the third resistor R3 is connected to the first node PA, and the second terminal is connected to the output terminal EN. Thus, the transmission of the direct current signal at the first node PA to the output terminal EN can be achieved. Of course, the transmission module 102 may also be implemented by a circuit comprising an inductor, the first terminal of the inductor is connected to the first node PA and the second terminal is connected to the output terminal EN, or the first terminal of the inductor is connected to the second terminal of the first resistor R1 and the second terminal is connected to the output terminal EN. Thus, the transmission of the direct current signal at the first node PA to the output terminal EN can also be achieved.

As a specific example of the first conducting module 103, the first conducting module 103 in the embodiment of the present disclosure comprises a first diode D1. The anode of the first diode D1 is connected to the output terminal EN and the cathode is connected to the first node PA to ensure that the electric potential at the output terminal EN does not exceed the electric potential at the first node PA. The first diode D1 may conduct the part of the alternating current signal from the second input terminal Swire, which is higher than the electric potential at the first node PA, to the first node PA.

As a specific example of the first filter module 104, the first filter module 104 in the embodiment of the present disclosure comprises a first capacitor C1. The first terminal of the first capacitor C1 is connected to the first node PA and the second terminal is connected to the common terminal GND. The capacitance value of the first capacitor C1 can be appropriately set according to the frequency range of the alternating current signal of the second input terminal Swire such that the first capacitor C1 can be used to filter the signal at the first node PA. At the first node PA, the first capacitor C1 may conduct the alternating current signal from the second input terminal Swire to the common terminal GND.

In the embodiments of the present disclosure, if the impedance between the first node PA and the output terminal EN is too small, while the direct current signal from the first node PA may be transmitted to the output terminal EN, the alternating current signal from the second input terminal Swire may also pass the path between the first node PA and the output terminal EN and be conducted by the first filter module 104 to the common terminal GND. Thus, the transmission module 102 of the embodiments of the present disclosure may have a sufficiently large resistance and/or inductance to impede the passing of the alternating current signal from the second input terminal Swire, reducing the conduction component of the alternating current signal on the path between the first node PA and the output terminal EN.

As a specific example of the second conducting module 105, the second conducting module 105 in the embodiments of the present disclosure comprises a second diode D2 whose anode is connected to the common terminal GND, and whose cathode is connected to the output terminal EN. The second diode D2 may conduct the part of the alternating current signal from the second input terminal Swire lower than the electric potential at the first node PA to the common terminal GND. In the embodiment of the present disclosure, the first conducting module 103, the first filter module 104, and the second conducting module 105 may maintain the electric potential at the output terminal EN between the voltage of the common terminal GND and the electric potential at the first input terminal Vin.

In practical applications, the enable signal required by the DC-DC power supply chip has both a direct current component and an alternating current component. The alternating current component is a valid signal which may allow the DC-DC power supply chip to adjust its own output voltage according to the number of pulses in the alternating current component. The direct current component is used to make the enable signal to have a certain level height such that the DC-DC power supply chip can clearly determine the number of pulses.

In the embodiment of the present disclosure, the direct current component may be provided by a direct current signal from the first input terminal Vin. The alternating current component is provided by an alternating current signal from the second input terminal Swire. Thus, in order to avoid being affected by the direct current signal input at the second input terminal Swire, the enable signal generation circuit may further comprise an isolation module 106 provided between the second input terminal Swire and the output terminal EN, for transmitting the alternating current signal and isolating the direct current signal. For example, the isolation module 106 comprises a second capacitor C2. The first terminal of the second capacitor C2 is connected to the second input terminal Swire and the second terminal is connected to the output terminal EN. The characteristic of the capacitor itself is blocking the passage of the direct current signal and conducting the alternating current signal in a certain frequency range at an appropriate capacitance value. Thus, it is possible not only to prevent the enable signal generation circuit from being affected by the direct current signal inputted at the second input terminal Swire, but also further solve the problem that the conventional signal Swire needs to comprise a start segment and an end segment corresponding to the timing sequence of the inputted voltage in order to cooperate with the timing sequence of the voltage inputted at the first input terminal Vin, so as to improve the applicability of the circuit.

In practical applications, the signal received by the first input terminal Vin may possibly comprise an alternating current signal, which introduces interference noise into the circuit, and may damage the device or output a wrong signal in severe cases. To avoid this problem, the enable signal generation circuit provided by the embodiments of the present disclosure may further comprise a second filter module 107. The second filter module 107 is configured to filter the signal input from the first input terminal Vin such that the alternating current signal at the first input terminal Vin can be conducted to the common terminal GND. For example, the second filter module 107 comprises a third capacitor C3. The first terminal of the third capacitor C3 is connected to the first input terminal Vin, and the second terminal of the third capacitor C3 is connected to the common terminal GND. Of course, the capacitance value of the third capacitor C3 may be set according to the frequency range of the above-described alternating current signal.

Figure 3:
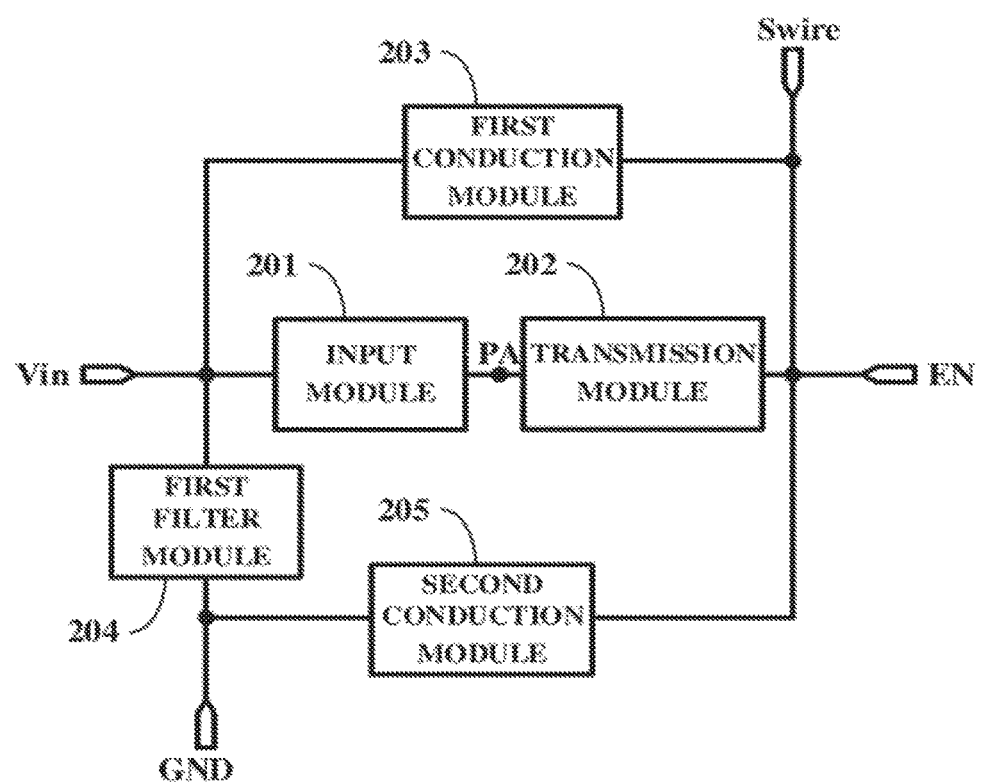
FIG. 3 is a block diagram of an enable signal generation circuit according to a second embodiment of the present disclosure.

Based on the same inventive concept, FIG. 3 is a block diagram of an enable signal generation circuit according to a second embodiment of the present disclosure. Referring to FIG. 3, the enable signal generation circuit is connected to the common terminal GND, the first input terminal Vin, the second input terminal Swire, and the output terminal EN. The circuit comprises an input module 201, a transmission module 202, a first conducting module 203, and a second conducting module 205. The second input terminal Swire is connected to the output terminal En. The input module 201 is connected to the first input terminal Vin and inputs the direct current signal from the first input terminal Vin to the first node PA in response that the electric potential at the first input terminal Vin is higher than the preset voltage value. The first filter module 204 filters the signal at the first input terminal Vin such that the alternating current signal at the first input terminal Vin is conducted to the common terminal GND. The transmission module 202 transmits the direct current signal from the first input terminal Vin to the output terminal EN in response that the first node PA receives the direct current signal. The first conducting module 203 is connected to the second input terminal Swire, and conducts the signal in the alternating current signal from the second input terminal Swire, which is higher than the electric potential at the first input terminal Vin, to the first input terminal Vin. The second conducting module 205 is connected to the second input terminal Swire to conduct the signal in the alternating current signal from the second input terminal Swire, which is lower than the electric potential at the common terminal GND, to the common terminal GND.

In the embodiments of the present disclosure, in response that the electric potential at the first input terminal is higher than the preset voltage value, the input module 201 may superimpose the direct current signal from the first input terminal Vin together with the alternating current signal from the second input terminal Swire via the transmission module 202 to the output terminal EN. In other cases, the electric potential at the first input terminal Vin corresponds to that of the common terminal GND, the first conducting module 203 and the first filter module 204 may conduct the positive half of said alternating current signal to the common terminal GND, and the second conducting module 205 may conduct the negative half of said alternating current signal to the common terminal GND. According to the above circuit structure, the present disclosure can automatically generate an enable signal based on the input signal, so as solve the problem that the DC-DC power supply chip does not work normally due to the difference between timing sequences of the inputted signals.

Figure 4:
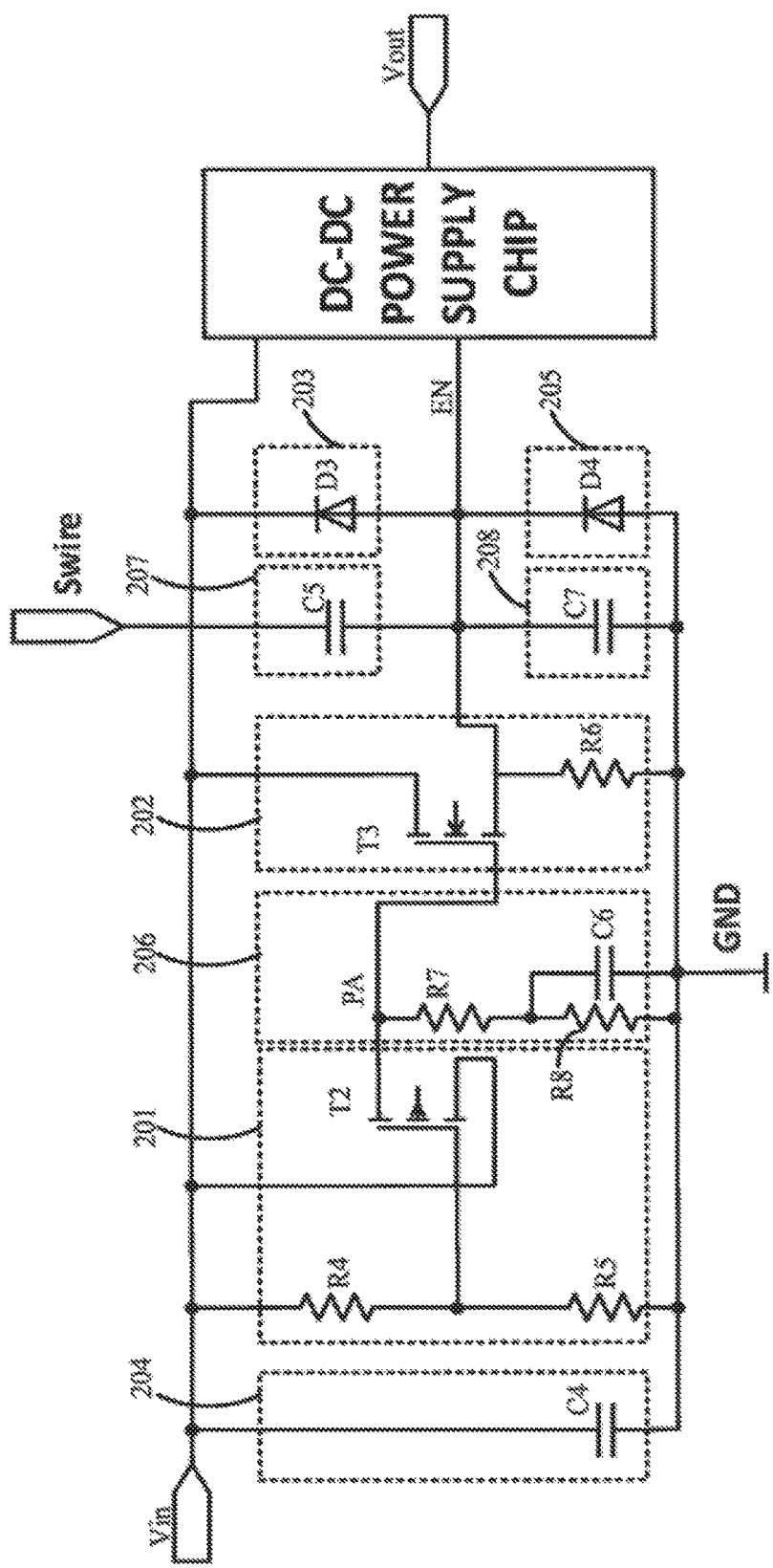
FIG. 4 is a schematic circuit diagram of the enable signal generation circuit of the embodiment shown in FIG. 3.

FIG. 4 is a schematic circuit diagram of the enable signal generation circuit of the embodiment shown in FIG. 3. See FIG. 4, as a specific example of the input module 201, the input module 201 in the embodiment of the present disclosure comprises a second transistor T2. The gate electrode of the second transistor T2 is connected to the first input terminal Vin, the first electrode of the second transistor T2 is connected to the first input terminal Vin, and the second electrode of the second transistor T2 is connected to the first node PA. For example, the second transistor T2 is a PMOS transistor, the control electrode of the second transistor T2 is the gate electrode, the first electrode of the second transistor T2 is the source electrode, and the second electrode of the second transistor T2 is the drain electrode. The gate electrode of the second transistor T2 is connected to the first input terminal Vin, the source electrode is connected to the first input terminal Vin, and the drain electrode is connected to the first node PA. In response that the electric potential difference between the gate electrode and the source electrode is sufficiently low, the second transistor T2 is turned on, such that the direct current signal from the first input terminal Vin is input to the first node PA. Of course, the resistance between the first input terminal Vin and the gate electrode of the second transistor T2 should be greater than the resistance between the first input terminal Vin and the source electrode of the second transistor T2 such that, in response that the electric potential at the first input terminal Vin is sufficiently high, the electric potential difference between the gate electrode and the source electrode of the second transistor T2 may be low enough to maintain the turning on of the second transistor T2.

As another example not shown in the drawings, the second transistor T2 may also be an NMOS transistor. The gate electrode of the second transistor T2 is connected to the first input terminal Vin, the drain electrode is connected to the first input terminal Vin, and the source electrode is connected to the first node PA. At this time, the resistance between the first input terminal Vin and the gate electrode of the second transistor T2 should be less than the resistance between the first input terminal Vin and the source electrode of the second transistor T2 such that in response that the electric potential at the first input terminal Vin is sufficiently high, the electric potential difference between the gate electrode and the source electrode of the second transistor T2 may be high enough to maintain the turning on of the second transistor T2.

In addition, the second transistor T2 abovementioned may also be another type of transistor, and the connection relationship between the source electrode and the drain electrode thereof may be set with reference to the above-described embodiment, and will not be described here.

In order to provide the above preset voltage value, the input module 201 provided by another embodiment of the present disclosure further comprises a fourth resistor R4 and a fifth resistor R5. The first terminal of the fourth resistor R4 is connected to the first input terminal Vin, and the second terminal of the fourth resistor R4 is connected to the first terminal of the fifth resistor R5 and the gate electrode of the second transistor T2 in the input module 201. The second terminal of the fifth resistor R5 is connected to the common terminal GND. The resistance ratio between the fourth resistor R4 and the fifth resistor R5 is equal to the ratio, which is between the preset voltage value and the turn-on voltage of the second transistor T2, minus one. Thus, the resistance value of the fourth resistor R4 and the resistance value of the fifth resistor R5 may be set based on the turn-on voltage of the second transistor T2 to obtain a desired preset voltage value. For example, when the desired preset voltage value is 5V and the turn-on voltage of the second transistor T2 is 0.7 V, the resistance value of the fourth resistor R4 may be 43 kΩ and the resistance value of the fifth resistor R5 is 7 kΩ. Thus, when the voltage at the first input terminal Vin is higher than 5V, the second transistor T2 may be turned on.

As a specific example of the first filter module 204, the first filter module 204 in the embodiment of the present disclosure comprises a fourth capacitor C4. The first terminal of the fourth capacitor C4 is connected to the first input terminal Vin, and the second terminal of the fourth capacitor C4 is connected to the common terminal GND. The capacitance value of the fourth capacitor C4 may be appropriately set according to the frequency range of the alternating current signal of the second input terminal Swire such that the fourth capacitor C4 may be used to filter the signal at the first input terminal Vin. At the first input terminal Vin, the fourth capacitor C4 may cause the alternating current signal from the second input terminal Swire to be conducted to the common terminal GND.

On the other hand, when the direct current signal of the first input terminal Vin comprises other signals such as a sharp pulse, it may cause an error action of the second transistor T2, thereby generating a wrong enable signal. To avoid this problem, the first filter module 204 may also transmit the alternating current signal to the common terminal GND, thereby ensuring that the direct current signal at the first input terminal Vin is substantially constant to avoid the generation of a wrong enable signal.

As a specific example of the transmission module 202, the transmission module 202 in the embodiment of the present disclosure comprises a sixth resistor R6 and a third transistor T3. The first terminal of the sixth resistor R6 is connected to the output terminal EN and the second terminal of the sixth resistor R6 is connected to the common terminal GND. The control electrode (the gate electrode) of the third transistor T3 is connected to the first node PA, the first electrode (one of the source electrode and the drain electrode) is connected to the first input terminal Vin, and the second electrode (the other of the source electrode and the drain electrode) is connected to the output terminal EN. In response that the input module 201 outputs the direct current signal from the first input terminal Vin, the third transistor T3 is turned on and the voltage at the first input terminal Vin may be conducted to the output terminal EN through the first electrode and the second electrode of the third transistor T3 (the source electrode and the drain electrode). It may be understood that the resistance value of the sixth resistor R6 may determine the range of the voltage value at the output terminal EN, whereby the magnitude of the direct current component of the signal at the output terminal EN can be adjusted by setting the resistance value of the sixth resistor R6.

As a specific example of the first conducting module 203, the first conducting module 203 in the embodiment of the present disclosure comprises a third diode D3. The anode of the third diode D3 is connected to the output terminal EN, and the cathode of the third diode D3 is connected to the first input terminal Vin. When the electric potential at the output terminal EN is higher than the electric potential at the first input terminal Vin, the third diode D3 can ensure that the electric potential at the output terminal EN does not exceed the electric potential at the first input terminal Vin, such that the part of the alternating current signal of the second input terminal Swire higher than the electric potential at the first input terminal Vin is conducted to the first input terminal Vin.

As a specific example of the second conducting module 205, the second conducting module 205 in the embodiment of the present disclosure comprises a fourth diode D4. The anode of the fourth diode D4 is connected to the common terminal GND and the cathode of the fourth diode D4 is connected to the output terminal EN. In response that the voltage of the output terminal EN is lower than the electric potential of the common terminal GND, the second conducting module 205 conducts the part of the alternating current signal from the second input terminal Swire, which is lower than the electric potential at the first input terminal Vin, to the common terminal GND. In the embodiments of the present disclosure, the first conducting module 203, the first filter module 204, and the second conducting module 205 may maintain the electric potential at the output terminal EN between the voltage of the common terminal GND and the electric potential at the first input terminal Vin.

As shown in FIG. 4, the enable signal generation circuit provided in the embodiment of the present disclosure may further comprise a delay module 206 for extending the elapsed time during which the direct current signal from the first input terminal Vin is input to the first node PA. The delay module 206 comprises a sixth capacitor C6, the first terminal of the sixth capacitor C6 is connected to the first node PA and the second terminal of the sixth capacitor C6 is connected to the common terminal GND. The delay module can delay the change of the gate voltage of the third transistor T3 to slow down the rising speed of the electric potential of the enable signal, thereby slowing the start time of the DC-DC power supply chip and reducing the impact current during the start of the DC-DC power supply chip.

The delay module provided by the embodiment of the present disclosure may further comprise a seventh resistor R7 and an eighth resistor R8. The first terminal of the seventh resistor R7 is connected to the first node PA and the second terminal of the seventh resistor R7 is connected to the first terminal of the eighth resistor R8. The second terminal of the eighth resistor R8 is connected to the common terminal GND. At this time, the first terminal of the sixth capacitor C6 is connected to the first terminal of the eighth resistor R8, and the second terminal of the sixth capacitor C6 is connected to the second terminal of the eighth resistor R8. Based on this circuit structure, the resistance value and the capacitance value can be set to adjust and control the delay effect.

In practical applications, the enable signal required by the DC-DC power supply chip has both a direct current component and an alternating current component. The alternating current component is a valid signal which may allow the DC-DC power supply chip to adjust its own output voltage according to the number of pulses in the alternating current component. The direct current component is used to make the enable signal have a certain level height such that the DC-DC power supply chip can clearly determine the number of pulses.

In the embodiment of the present disclosure, the direct current component may be provided by a direct current signal from the first input terminal Vin. The alternating current component may be provided by an alternating current signal from the second input terminal Swire.

Thus, in order to avoid the affection of the direct current signal inputted at the second input terminal Swire, the enable signal generation circuit abovementioned may further comprise an isolation module 207 provided between the second input terminal Swire and the output terminal EN, for transmitting an alternating current signal and isolating an direct current signal. For example, the isolation module 207 comprises a fifth capacitor C5, the first terminal of the fifth capacitor C5 is connected to the second input terminal Swire, and the second terminal of the fifth capacitor C5 is connected to the output terminal EN. The characteristic of the capacitor itself is blocking the passing of the direct current signal and conducting the alternating current signal in a certain frequency range at the appropriate capacitance value. Thus, it is possible not only to enable the enable signal generation circuit to avoid being affected by the direct current signal inputted at the second input terminal Swire, but also to further solve the problem that the conventional signal Swire art needs to comprise a start segment and an end segment corresponding to the timing sequence of the inputted voltage in order to cooperate with the timing sequence of the voltage inputted at the first input terminal Vin, so as to improve the applicability of the circuit. In practical applications, the isolation module 207 may also be implemented using a transformer, which may also isolate the direct current component in the signal at the second input terminal Swire, and only allow the active alternating current component to be input to the output terminal EN. In particular, the specific structure of the isolation module 207 may be selected by those skilled in the art according to the application scenario, and the disclosure is not limited thereto.

As shown in FIG. 4, the enable signal generation circuit provided by the embodiment of the present disclosure may further comprise a second filter module 208 for filtering the signal at the output terminal such that an alternating current signal other than the alternating current signal from the second input terminal Swire is conducted to the common terminal GND. The second filter module 208 comprises a seventh capacitor C7, the first terminal of the seventh capacitor C7 is connected to the output terminal EN, and the second terminal of the seventh capacitor C7 is connected to the common terminal GND. The seventh capacitor C7 can further filter out the alternating current noise at the second input terminal Swire, thereby facilitating the efficient detection of the alternating current signal from the second input terminal Swire by the DC-DC power supply chip.

Figure 5:
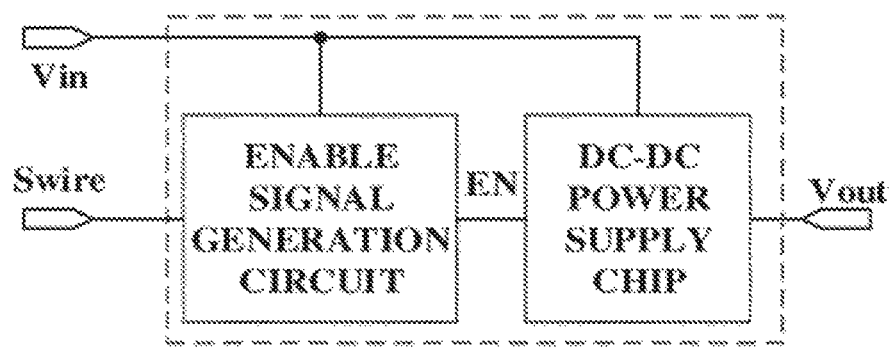
FIG. 5 is a block diagram of a power conversion circuit according to a third embodiment of the present disclosure.

The present disclosure further provides a power conversion circuit based on the same inventive concept. FIG. 5 is a block diagram of a power conversion circuit according to a third embodiment of the present disclosure. As shown in FIG. 5, the power conversion circuit comprises an enable signal generation circuit of any one of the above, and provides an enable signal for the DC-DC power supply chip. It can be seen that there is no need to design a circuit structure for forming a step-type voltage for the power conversion circuit, or separately design input pins of the enable signal, thereby simplifying the circuit structure, reducing the chip size, and reducing production costs.

In addition, since the enable signal generation circuit may further act as an access circuit of the signal Swire while providing an enable signal, that is, constitute a novel DC-DC power supply chip by being directly combined with a partial structure in the DC-DC power supply chip, it is possible to further simplify the circuit structure, reduce the chip size, and reduce production costs.

Based on the same inventive concept, a fourth embodiment of the present disclosure further provides a data driving circuit comprising a power conversion circuit of any one of the preceding. Since the data driving circuit comprises the power conversion circuit according to any one of the preceding, it can solve the same technical problem and achieve the same technical effect, and will not be described herein in detail.

A fifth embodiment of the present disclosure further provides a display device comprising a data driving circuit of any one of the above. It should be noted that the display device in the present embodiment may be any product or component having a display function, such as a display panel, an electronic paper, a mobile phone, a tablet computer, a television set, a notebook computer, a digital photo frame, a navigator, or the like. The display device comprises any of the above-described data driving circuits, and hence can solve the same technical problem, and achieve the same technical effect, and will not be described herein in detail any more.

It should be noted in the description of the present disclosure that the directional or positional relationship indicated by the terms "up", "down" and the like is based on the directional or positional relationship shown in the drawings only for the purpose of facilitating and simplifying the description of the disclosure, rather than suggesting or implying that the indicated device or element must have a specific direction, be constructed and operated in a particular direction. Therefore, these terms cannot be construed as limiting the disclosure. Unless otherwise explicitly specified and defined, the terms "installation", "connection", "attachment" should be understood in a broad sense, for example, it may be a fixed connection, and may also be a detachable connection or as an integral connection; it may be a mechanical connection, may also be an electrical connection; it may be a direct connection, may also be an indirect connection through an intermediate medium, and may be a connectivity inside two elements. The specific meaning of the above-mentioned terms in the present disclosure may be understood by those skilled in the art according to specific circumstances.

It is also to be understood that in this context, relational terms such as first and second are used only to distinguish one entity or operation from another entity or operation without necessarily requiring or implying that between these entities or operations there is any such actual relationship or sequence. Moreover, the term "comprising", "including" or any other variant thereof is intended to encompass a non-exclusive inclusion, such that processes, methods, articles, or devices, which comprise a series of elements, comprise not only those elements but also those not explicitly listed, or further comprise elements that are inherent to such processes, methods, articles, or devices. In the absence of more restrictions, the elements defined by the statement "comprising one . . . " do not preclude the presence of additional same elements in the processes, methods, articles, or devices that comprise the elements.

The above embodiments are merely illustrative of the technical solutions of the present disclosure and are not intended to limit the disclosure. It should be understood that although the present disclosure has been described in detail with reference to the foregoing embodiments, those of ordinary skill in the art will still be able to modify the technical solutions recited in the foregoing embodiments or make equivalent substitutions to part of the technical features therein. Such modifications or substitutions do not depart the essence of the corresponding technical solution from the spirit and scope of the disclosure.

The invention claimed is:

1. An enable signal generation circuit comprising:
 an input module, connected to a first input terminal, and configured to input a direct current signal from the first input terminal to a first node in response to an electric potential at the first input terminal exceeding a preset voltage value;

a first filter module, configured to filter a signal at the first input terminal such that an alternating current signal at the first input terminal is conducted to a common terminal;

a transmission module, configured to transmit the direct current signal from the first input terminal to an output terminal in response that the direct current signal is received at the first node;

a first conducting module, connected to a second input terminal, and configured to conduct a first portion of an alternating current signal that is greater than the electric potential at the first input terminal from the second input terminal to the first input terminal;

a second conducting module, connected to the second input terminal, and configured to conduct a second portion of the alternating current signal that is lower than an electric potential at the common terminal from the second input terminal to the common terminal;

wherein the second input terminal is connected to the output terminal.

2. The enable signal generation circuit according to claim 1, wherein the input module comprises a second transistor, a control electrode of the second transistor is connected to the first input terminal, a first electrode of the second transistor is connected to the first input terminal, and a second electrode of the second transistor is connected to the first node.

3. The enable signal generation circuit according to claim 2, wherein the input module further comprises a fourth resistor and a fifth resistor, wherein a first terminal of the fourth resistor is connected to the first input terminal, and a second terminal of the fourth resistor is connected to a first terminal of the fifth resistor and the control electrode of the second transistor;

wherein a second terminal of the fifth resistor is connected to the common terminal; and wherein the resistance ratio between the fourth resistor and the fifth resistor is equal to the ratio, which is between the preset voltage value and a turn-on voltage of the second transistor, minus one.

4. The enable signal generation circuit according to claim 1, wherein the first filter module comprises a fourth capacitor, a first terminal of the fourth capacitor is connected to the first input terminal, and a second terminal of the fourth capacitor is connected to the common terminal.

5. The enable signal generation circuit according to claim 1, wherein the transmission module comprises a sixth resistor and a third transistor;

wherein a first terminal of the sixth resistor is connected to the output terminal and the second terminal of the sixth resistor is connected to the common terminal; and wherein a control electrode of the third transistor is connected to the first node, a first electrode of the third transistor is connected to the first input terminal, and a second electrode of the third transistor is connected to the output terminal.

6. The enable signal generation circuit according to claim 1, wherein the first conducting module comprises a third diode, an anode of the third diode is connected to the output terminal, and a cathode of the third diode is connected to the first input terminal.

7. The enable signal generation circuit according to claim 1, wherein the second conducting module comprises a fourth diode, an anode of the fourth diode is connected to the common terminal, and a cathode of the fourth diode is connected to the output terminal.

8. The enable signal generation circuit according to claim 1 further comprising an isolation module, provided between the second input terminal and the output terminal, and configured to transmit an alternating current signal and isolating a direct current signal.

9. The enable signal generation circuit according to claim 8, wherein the isolation module comprises a fifth capacitor, a first terminal of the fifth capacitor is connected to the second input terminal, and a second terminal of the fifth capacitor is connected to the output terminal.

10. The enable signal generation circuit according to claim 1 further comprising:

a delay module, provided between the first node and the common terminal, and configured to extend the elapsed time during which the direct current signal from the first input terminal is inputted to the first node.

11. The enable signal generation circuit according to claim 10, wherein the delay module comprises a sixth capacitor, a first terminal of the sixth capacitor is connected to the first node and a second terminal of the sixth capacitor is connected to the common terminal.

12. The enable signal generation circuit according to claim 1, further comprising:

a second filter module, provided between the output terminal and the common terminal, and configured to filter the signal at the output terminal such that, an alternating current signal other than the alternating current signal from the second input terminal is conducted to the common terminal.

13. The enable signal generation circuit according to claim 12, wherein the second filter module comprises a seventh capacitor, a first terminal of the seventh capacitor is connected to the output terminal and a second terminal of the seventh capacitor is connected to the common terminal.

14. A power conversion circuit comprising the enable signal generation circuit according to claim 1.

15. A data driving circuit comprising the power conversion circuit according to claim 14.

16. A display device comprising the data driving circuit according to claim 15.

* * * * *